(12) United States Patent
Bartesaghi et al.

(10) Patent No.: US 7,657,071 B2
(45) Date of Patent: Feb. 2, 2010

(54) SYSTEMS, DEVICES, AND METHODS FOR BUNDLE SEGMENTATION IN DIFFUSION TENSOR MAGNETIC RESONANCE IMAGING

(75) Inventors: Alberto Bartesaghi, Herndon, VA (US); Mariappan S. Nadar, Plainsboro, NJ (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 730 days.

(21) Appl. No.: 11/401,137

(22) Filed: Apr. 10, 2006

(65) Prior Publication Data

US 2006/0281987 A1    Dec. 14, 2006

Related U.S. Application Data

(60) Provisional application No. 60/670,178, filed on Apr. 11, 2005.

(51) Int. Cl.
*G06K 9/00* (2006.01)
*A61B 5/05* (2006.01)

(52) U.S. Cl. ..................................... 382/128; 600/410

(58) Field of Classification Search ................ 382/128, 382/129, 130, 131, 132, 133, 134, 164, 171, 382/173, 177, 179; 600/410, 524, 407, 411, 600/425; 324/307, 309, 315, 316; 430/39; 424/9.3
See application file for complete search history.

(56) References Cited

U.S. PATENT DOCUMENTS

| | | | | |
|---|---|---|---|---|
| 6,526,305 | B1* | 2/2003 | Mori | 600/410 |
| 6,614,226 | B2* | 9/2003 | Wedeen | 324/309 |
| 7,567,693 | B2* | 7/2009 | deCharms | 382/128 |

OTHER PUBLICATIONS

Mori. Susumu et al., "Fiber tracking: principles and strategies—a technical review," NMR in Biomedicine 2002:15:468-480.
Jackowski, Marcel et a. "Estimation of Anatomical Connectivity by Anisotropic Front Propagation and Diffusion Tensor Imaging."
Ramirex-Manzanares, Alonso et al., "Brain Nerve Bundles Estimation by Restoring and Filtering Intra-Voxel Information in Diffusion Tensor MRI."
Lenglet, Christophe et al., "Anatomical Connectivity Mapping Inferred from OTI-based White Matter Geometry."
O'Donnell, Lauren et al., "New Approaches to Estimation of White Matter Connectivity in Diffusion Tensor MRI: Elliptic PDEs and Geodesics in a Tensor-Warped Space."
Corouge, Isabelle et al., "A Statistical Shape Model of Individual Fiber Tracts Extracted from Diffusion Tensor MRI," MICCAI 2004 conference proceedings LNCS 3127 (Part ii): 671-679.
Sethian, J.A. "A fast marching level set method for monotonically advancing fronts," Proc Natl Acad Sci USA 93:1591-1595 1996.

(Continued)

*Primary Examiner*—Abolfazl Tabatabai

(57) ABSTRACT

Certain exemplary embodiments can comprise a method that can comprise automatically causing a representation of body tissue to be rendered. The representation of the body tissue can comprise a plurality of voxels located in an interior region of the body tissue. Each of the plurality of voxels can have a negative value of an energy change function.

13 Claims, 17 Drawing Sheets

6000

OTHER PUBLICATIONS

Brun, Anders et al., "Clustering Fiber Traces Using Normalized Cuts," MICCAI 2004, LNCS 3216 pp. 368-375 2004.

Jonasson, Lisa et al. "White Matter Mapping in DT-MRI Using Geometric flows."

Wang, Zhizhou et al., "An Affine Invariant Tensor Dissimilarity Measure and its Applications to Tensor-valued Image Segmentation," Proceedings of the 2004 IEEE Computer Society Conference on Computer Vision and Pattern Recognition.

Chan, Tony f. et al. "a Level set algorithm for minimizing the Mumford-Shah functional in Image Processing."

Song, Bing, et al. "A Fast Algorithm for Level Set Based Optimization."

Gibou, Frederic, "A Fast Hybrid k-Means Level Set Algorithm For Segmentation."

Feddern, Christian et al., "Level-Set Methods for Tensor-Valued Images."

Lenglet, Christophe et al., "Statistics on Multivariate Normal Distributions: A Geometric Approach and its Application to Diffusion Tensor MRI."

Alexander, Daniel et al., Similarity Measure for Matching Diffusion Tensor Images.

"Phamtom Images for Simulating Tractography Errors," http://neurology.iop.kcl.ac.uk/dtidataset/pages/linearFATrajectory.htm.

* cited by examiner

SYSTEMS, DEVICES, AND METHODS FOR BUNDLE SEGMENTATION IN DIFFUSION TENSOR MAGNETIC RESONANCE IMAGING

CROSS-REFERENCES TO RELATED APPLICATIONS

This application claims priority to, and incorporates by reference in its entirety, pending U.S. Provisional Patent Application Ser. No. 60/670,178, filed 11 Apr. 2005.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DEFINITIONS

Figure 1A:
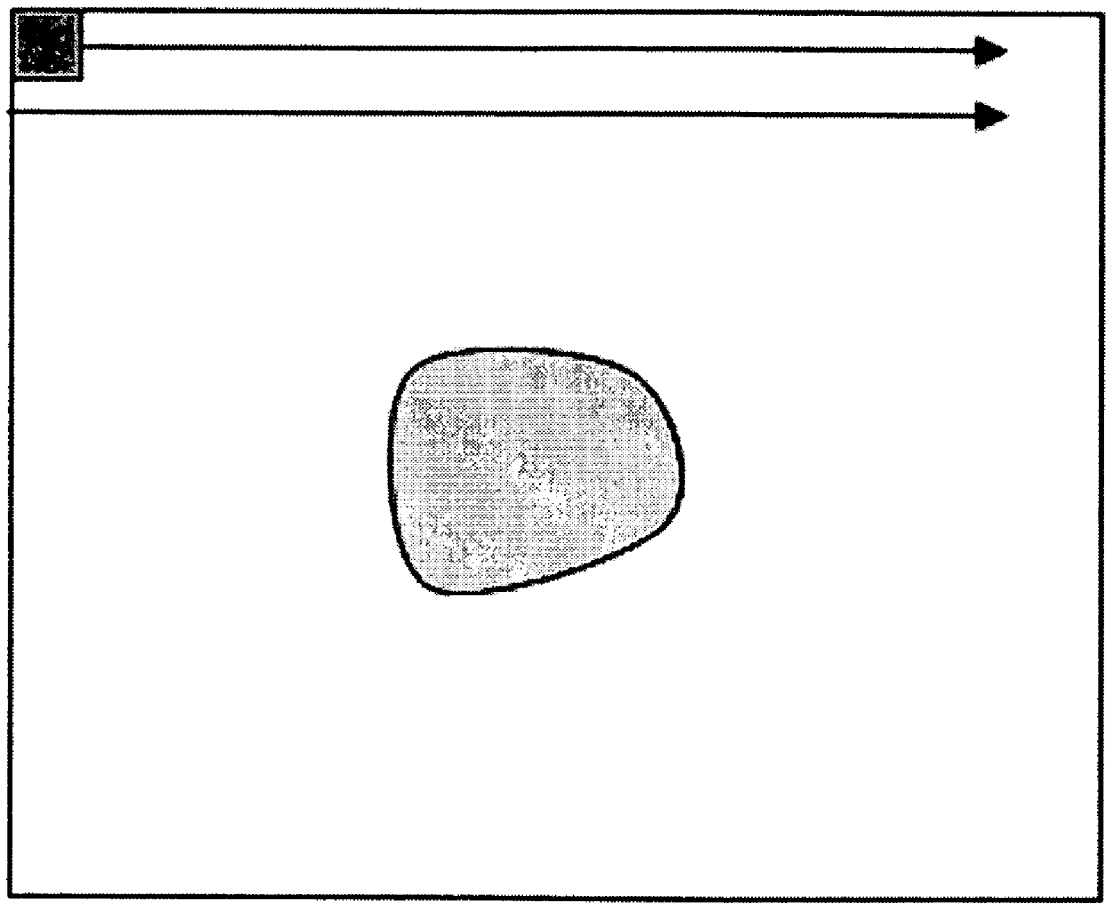
FIG. 1A is a diagram of an exemplary sweep across a full image.

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

- a—at least one.
- activity—an action, act, step, and/or process or portion thereof.
- adapted to—made suitable or fit for a specific use or situation.
- and/or—either in conjunction with or in alternative to.
- apparatus—an appliance or device for a particular purpose
- approximate—nearly the same as.
- approximation—an estimate that is nearly the same as.
- associated with—related to.
- automatically—acting or operating in a manner essentially independent of external influence or control. For example, an automatic light switch can turn on upon "seeing" a person in its view, without the person manually operating the light switch.
- average—approximating a statistical expected value.
- band—a plurality of voxels approximately surrounding an interior region.
- based upon—being derived from.
- between—associated with a separating interval.
- brain—a portion of a vertebrate central nervous system that is enclosed within a cranium, continuous with a spinal cord, and composed of gray matter and white matter.
- bundle—a plurality of closely bound fibers.
- can—is capable of, in at least some embodiments.
- cause—to produce an effect.
- change—a transformation or transition from one state, condition, or phase to another.
- comprising—including but not limited to.
- compute—to determine by mathematics.
- data—distinct pieces of information, usually formatted in a special or predetermined way and/or organized to express concepts.
- define—to establish the outline, form, or structure of.
- denote—to indicate.
- determine—ascertain, obtain, and/or calculate.
- device—a machine, manufacture, and/or collection thereof.
- distance—a spatial separation between to points.
- domain—a set of all possible values of an independent variable of a function.
- energy change function—a mathematical expression indicative of a difference in a degree of agreement of a model with measured data.
- equation—a statement asserting the equality of two expressions, usually written as a linear array of symbols that are separated into left and right sides and joined by an equal sign.
- Euclidean space—of or related to a two or three dimensional area or region.
- exterior region—an area external to a defined interior region.
- fiber—a slender and greatly elongated component of the human brain, a neuron, and/or an axon.
- function—a defined mathematical relationship.
- gradient—a rate of change with respect to distance of a variable quantity.
- haptic—involving the human sense of kinesthetic movement and/or the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and thermal capacity.
- image—an at least two-dimensional representation of an object and/or phenomenon.
- information device—any device capable of processing information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can comprise components such as one or more network interfaces, one or more processors, one or more memories containing instructions, and/or one or more input/output (I/O) devices, one or more user interfaces coupled to an I/O device, etc.

initial—at a beginning.

initialize—to prepare something for use and/or some future event.

input/output (I/O) device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.

inside—within a predetermined boundary.

interior region—a spatial location within a predetermined boundary.

intrinsic—belonging to a thing by a very nature of the thing.

local—associated with a predetermined area or region.

machine instructions—directions adapted to cause a machine, such as an information device, to perform a particular operation or function. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine readable medium—a physical structure from which a machine can obtain data and/or information. Examples include a memory, punch cards, etc.

may—is allowed and/or permitted to, in at least some embodiments.

measurement—a dimension, quantification, and/or capacity, etc. determined by observation.

memory device—an apparatus capable of storing analog or digital information, such as instructions and/or data. Examples include a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and/or can store instructions adapted to be executed by processor, such as according to an embodiment disclosed herein.

method—a process, procedure, and/or collection of related activities for accomplishing something.

metric—a measurement.

negative—less than approximately zero.

neighbor—(v.) to be close, adjacent, and/or approximately adjacent to.

network—a communicatively coupled plurality of nodes. A network can be and/or utilize any of a wide variety of sub-networks, such as a circuit switched, public-switched, packet switched, data, telephone, telecommunications, video distribution, cable, terrestrial, broadcast, satellite, broadband, corporate, global, national, regional, wide area, backbone, packet-switched TCP/IP, Fast Ethernet, Token Ring, public Internet, private, ATM, multi-domain, and/or multi-zone sub-network, one or more Internet service providers, and/or one or more information devices, such as a switch, router, and/or gateway not directly connected to a local area network, etc.

network interface—any device, system, or subsystem capable of coupling an information device to a network. For example, a network interface can be a telephone, cellular phone, cellular modem, telephone data modem, fax modem, wireless transceiver, Ethernet card, cable modem, digital subscriber line interface, bridge, hub, router, or other similar device.

not—a negation of something.

packet—a discrete instance of communication.

piecewise smooth—a function defined by an approximately continuous curve and a non-constant value within each of various intervals.

plurality—the state of being plural and/or more than one.

point—(n.) a defined location in at least a two-dimensional system.

point—(v.) to indicate a position and/or direction of.

positive—greater than approximately zero.

predetermined—established in advance.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

promote—designate as a member of a predetermined group.

render—make perceptible to a human, for example as data, commands, text, graphics, audio, video, animation, and/or hyperlinks, etc., such as via any visual, audio, and/or haptic means, such as via a display, monitor, electric paper, ocular implant, cochlear implant, speaker, etc.

repeatedly—again and again; repetitively.

represent—to be considered as an acceptable equivalent of.

representation—an equivalent of.

set—a related plurality.

signal—an indicator that serves as a means of communication and/or an impulse or fluctuating electric, magnetic, or optical quantity, such as voltage, current, field strength, intensity, etc., whose variations represent coded information.

single—existing alone or consisting of one entity.

statistical parameter—a determined value indicative of properties of a sample and/or population.

store—to place, hold, and/or retain data, typically in a memory.

structure—a manner in which parts form a whole.

substantially—to a great extent or degree.

surface area—an extent of a 2-dimensional surface.

surround—to substantially enclose.

system—a collection of mechanisms, devices, data, and/or instructions, the collection designed to perform one or more specific functions.

tensor—a certain kind of geometrical entity, or alternatively a generalized "quantity". The tensor concept includes the ideas of scalar, vector, and linear operator. Tensors can be described in terms of coordinate systems, as arrays of scalars, but are defined so as to be independent of any chosen frame of reference.

three dimensional coordinates—values indicative of a position of a point in a defined space associated with three mutually perpendicular coordinate axes.

union—a set containing all and only the members of two or more given sets.

update—to change.

user interface—any device for rendering information to a user and/or requesting information from the user. A user interface includes at least one of textual, graphical, audio, video, animation, and/or haptic elements. A textual element can be provided, for example, by a printer, monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, trackball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pull-down list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.

value—an assigned or computed numerical quantity.

variance—a measure of variation of a set of observations defined by a sum of the squares of deviations from a mean, divided by a number of degrees of freedom in the set of observations.

via—by way of and/or utilizing.

voxel—a finite volume in three dimensional space representing a resolvable and/or renderable volume associated with a predetermined system.

DETAILED DESCRIPTION

Certain exemplary embodiments can comprise a method that can comprise automatically causing a representation of body tissue to be rendered. The representation of the body tissue can comprise a plurality of voxels located in an interior region of the body tissue. Each of the plurality of voxels can have a negative value of an energy change function.

Certain exemplary embodiments can comprise a general framework for the automatic segmentation of anatomical structures from Diffusion Tensor MRI. Certain exemplary embodiments can comprise an energy based approach to segmentation assuming a piecewise-smooth image model that can allow tensors to change orientation inside bundles, complemented by modeling of image statistics. Energy minimization can be carried out using a greedy region-growing algorithm that can be both efficient and robust. Although the framework can be general and any tensor metric can be supported, a simplified tensor can be a representation that adapts well to the DTI setting and improves computational performance. Segmentation results can be generated automatically from a single seed voxel as illustrated on several real and synthetic datasets.

Diffusion Tensor Imaging (DTI) can be a quantitative method that allows elucidation of physical properties of tissues through observation of the movement of water molecules. For example, a direction of most significant diffusion in brain white matter can correlate with a mean longitudinal direction of axons. As such, DTI can be a valuable quantitative approach that can allow non-invasive tracking of white matter fibers in the brain addressing anatomical connectivity in-vivo. A popular application in DTI can be tractography where tight arrangements of fibers running in parallel can be modeled as curvilinear trajectories in three-dimensional space. Clinical validation of tractography results can be an issue of concern, as exemplary methods might not provide a guarantee of physical connectivity. Partial volume effects, ambiguity at fiber crossings and inaccessibility of ground truth can be some of the reasons for this. One alternative (typically more robust due to increased redundancy) can be the segmentation of volumetric regions that contain arrangements of fibers corresponding to larger anatomical structures, e.g. corpus callosum, lateral ventricles, etc. In certain exemplary embodiments, group curves can be extracted with tractography into meaningful clusters. Segmentation procedures can comprise pre-alignment of individual curves and design of similarity measures between three-dimensional (3D) trajectories in order to define grouping criteria. Certain exemplary methods can share similar validation problems as tractography algorithms as the methods might rely on results to perform well. Certain exemplary embodiments can attempt 3D region segmentation directly on acquired tensor data. In a first approximation, generic image segmentation techniques can be applied using scalar quantities derived from tensor data. Since such models can disregard directional tensor information, a number of difficulties can arise in their implementation (e.g. proper initialization, ad-hoc limiting of propagation speed, careful selection of stopping criteria, etc.). Certain exemplary methods might not handle fiber crossings where scalar information alone might be not enough to resolve between intersecting components. Exemplary methods adapted to use complete tensor information might overcome this limitation. Certain exemplary embodiments can regard tensors as covariance matrices of Gaussian distributions and can utilize a symmetrized Kullback-Leibler distance to measure similarity between tensors. By plugging these measurements into a region-based segmentation model, a proper framework for the segmentation of two dimensional tensor images can be obtained. Certain exemplary embodiments can measure tensor similarity intrinsically on a six-dimensional statistical manifold. An introduction of a statistical component to a region-based formulation can be important as well, and can provide an appropriate tool for handling noisy DTI datasets. Certain exemplary embodiments comprise an assumption of a piecewise-constant image model.

Certain exemplary embodiments can comprise a statistical region-based tensor segmentation approach, which can assume a three-dimensional piecewise-smooth image model. While a statistical component can provide a framework for handling noisy images, the piecewise-smooth model accounts for the very nature of DTI data, which can allow tensors to change orientation inside fiber bundles. Certain exemplary embodiments can be adapted to capture highly convoluted structures. Energy minimization can be done using an ordered region-growing algorithm that can combine local and global information, which can allow accurate segmentations to be obtained in a short time.

Region-based segmentation models can be applied to segmentation of tensor data. A goal can be to partition an image $I_0(x): \Omega \subset \Re^n \to I$ into homogeneous regions $\Omega_1$ and $\Omega_2$ (separated by sharp boundaries $\Gamma$), such that $\Omega = \Omega_1 \cup \Omega_2$; where $I$ denotes an arbitrary image domain, e.g. $I = \Re$ for scalar images, $I = \Re^m$ for color or multivalued images, and $I$ can be the space of symmetric positive definite 3×3 tensors in the case of DTI. An optimal domain partition can be found as the minimizer of a segmentation energy:

$$E(I, \sigma_i, \Gamma) = \quad (1)$$

$$-\sum_{i=1,2} \int_{\Omega_i} \log p_i(d(I, I_0), \sigma_i) dx + \int_{\Omega \setminus \Gamma} |\nabla_d I|^2 dx + H^{n-1}(\Gamma)$$

where $I$ can be a piecewise smooth approximation of $I_0$, and the probability distributions $p_i$ of intrinsic distances $d(I, I_0)$ inside each region can be assumed to be one-sided Gaussians with zero mean and variance $\sigma_i$. The second term can control a smoothness of an approximation inside homogeneous regions, $\nabla_d$ can be an intrinsic image gradient. The third term, the (n−1)-dimensional Haussdorf measure of a boundary $\Gamma$ can controls a regularity of an edge set. Using the Heaviside function $H(x)=\{1, x \in \Omega_1; 0, x \in \Omega_2\}$ and defining $C^1$ functions $I_1$ and $I_2$ such that $I=I_1 H+I_2(1-H)$, the energy of equation (1) can be rewritten to obtain a potential segmentation model:

$$E(I_1, I_2, \sigma_1, \sigma_2, H) = \int_\Omega \left[\frac{1}{2}\left(\log 2\pi\sigma_1^2 + \frac{d^2(I_1, I_0)}{\sigma_1^2}\right) + |\nabla_d I_1|^2\right] H \, dx + \quad (2)$$

$$\int_\Omega \left[\frac{1}{2}\left(\log 2\pi\sigma_2^2 + \frac{d^2(I_2, I_0)}{\sigma_2^2}\right) + |\nabla_d I_2|^2\right](1-H) \, dx + \int_\Omega |\nabla H| \, dx$$

where $$p_i = \frac{1}{\sqrt{2\pi\sigma_i^2}} e^{\frac{d^2(I_i, I_0)}{2\sigma_i^2}}$$

and $H^{n-1}(\Gamma) = \int_{106} |\nabla H| dx$. Note that this formulation can be general in the sense that no particular image domain $I$ and no associated metric for computing the distances $d$ and $\nabla_d$ has been specified.

Certain exemplary formulations may be derived from this general model. A statistical component can be eliminated, i.e. assume $\sigma_1 = \sigma_2 = 1$, yielding a 3D extension of the segmentation model which might lack elements to handle noisy images. Similarly, if $I(x)$ is piecewise constant, i.e. $I_1 = c_1$ and $I_2 = c_2$, certain exemplary embodiments restrict tensors inside each region to be sampled from a distribution with constant mean tensor. The energy in Equation (2) can generalize alternative DTI segmentation models combining a statistical model with a piecewise-smooth image model in a unified framework.

Minimization of the energy in Equation 1 can be solved using the level set framework. Certain exemplary embodiments can comprise a number of fast minimization methods for the scalar (piecewise constant) case. Following this latter direction, a relatively efficient method can be used to minimize the more general energy in Equation (2). Starting from an initial seed voxel(s), an interior region can be grown one voxel at a time allowing changes that decrease the total energy. That is, boundary voxels on the outside can be considered for promotion based on respective contributions to the energy. Voxels that yield negative energy increments can be transferred to the interior set. When no more voxels can be promoted without increasing the energy, the algorithm can reach a local minima of the energy. The region-growing behavior of the algorithm (as opposed to sweeps across the entire image) can result in a single connected component. An order in which boundary voxels are considered for promotion can be chosen based upon an amount of energy change, voxels that decrease the energy most can be promoted first. This can be implemented with a priority-queue structure, similar to the one used in a fast marching algorithm, only that priorities can be constantly recomputed to reflect changes in global statistics.

The energy change resulting from promoting a single voxel at position x∈$\Omega_2$ to the interior region $\Omega_1$, according to Equation (2) can be expressed as:

$$\Delta E(x) = \log\frac{\sigma_1}{\sigma_2} + \frac{1}{2}\frac{d^2(I_1(x), I_0(x))}{\sigma_1^2} - \frac{1}{2}\frac{d^2(I_2(x), I_0(x))}{\sigma_2^2} + |\nabla_d I_1(x)|^2 - |\nabla_d I_2(x)|^2 + \Delta a(x) \quad (3)$$

where $\Delta a(x)$ is the surface area change computed from $$\sum \sqrt{H_x^2 + H_y^2 + H_z^2}.$$

Each promotion in turn, can have a global impact on the statistical parameters which can be updated as well. Variances $\sigma_i$'s can be updated according to:

$$\sigma_1^2 = \frac{\int_\Omega d^2(I_1(x), I_0(x))H(x)\,dx}{\int_\Omega H(x)\,dx}$$

$$\sigma_2^2 = \frac{\int_\Omega d^2(I_2(x), I_0(x))(1-H(x))\,dx}{\int_\Omega (1-H(x))\,dx}. \quad (4)$$

Smooth approximations $I_1(x)$ and $I_2(x)$ can be updated as local generalized means of image values $I_0$ in a neighborhood of x strictly inside $\Omega_1$ and $\Omega_2$, respectively.

For diffusion images, domain I can be the space of 3×3 positive definite symmetric tensors D. The energy framework can be general and any tensor metric may be used for evaluating distances and means for minimizing the energy. Intrinsic measurements on the six-dimensional manifold may be computed exactly, at the expense of computational complexity. Alternatively, less accurate approximations may be obtained at lower computational costs. Certain exemplary embodiments can comprise a simplified tensor representation that can allow a simple/fast implementation and yet exploit full tensor information. Consider the following vector representation: $\vec{y} = g \cdot \vec{e}_1$, where $\vec{e}_1$ (unit-norm) can be the principal direction of anisotropy of D and $0 \leq g \leq 1$ can be the amount of anisotropy, e.g. as measured by fractional anisotropy. Although eigenvectors and eigenvalues can be computed, the computation might be done only once for the full data set and subsequent calculations can be simplified significantly. Ill conditioning of an eigenvalue computation might not affect the representation as these correspond to g~0.

With this representation, a Euclidean metric can be used in three-space to measure distances: $d(I_i(x), I_0(x)) = |\vec{y}_i - \vec{y}_0|$, and $$\frac{1}{N}\sum_1^N \vec{y}_i$$

to compute means. Assuming vectors $\vec{y}$ have been pre-computed for all X∈$\Omega$, the algorithm can be summarized:

1. Initialize an interior region $\Omega_1$ to a single voxel inside a structure of interest.

2. Compute $I_1(x)$ as a local average inside $\Omega_1$, and $I_2(x)$ as a local average inside $\Omega_2$.

3. Initialize statistical parameters $\sigma_i$'s using Eqs. (4).

4. For all voxels surrounding $\Omega_1$, compute $\Delta E(x)$ using Eq. (3).

5. Promote voxel x with smallest $\Delta E(x)$ to $\Omega_1$.

6. Update $I_i(x)$'s and $\sigma_i$'s as before.

7. Repeat steps 4-6 while $\Delta E(x) < 0$.

The nature of the algorithm might not allow accepted voxels to be changed back to the background region $\Omega_2$. Although some simple mechanism may be provided to re-evaluate the energy at already accepted voxels, an alternative might be to refine the resulting segmentation with few iterations of a level set approach. None of this was utilized for the examples illustrated in FIGS. 3A-5D, as the minimizers obtained nicely followed the underlying tensor data and correlated very well with corresponding anatomical structures.

Results for the segmentation of the corpus callosum and the lateral ventricles on real volumes are illustrated in FIGS. 3A-5D. These comprised certain challenging situations where two structures touched each other, in the sense that algorithms based on scalar quantities alone might fail to produce the correct results and consideration of directional information becomes more important. Observe also the remarkable capture range of convoluted structures like the genu and the splenium of the corpus callosum. All volumes were obtained from a single seed voxel and running times were under a minute even for the higher resolution datasets. A step of curvature regularization was applied to all resulting surfaces for visualization purposes. We also present results on a dataset from in FIGS. 3A-3D further demonstrating robustness of the algorithm to noise.

Certain exemplary embodiments can comprise a general framework for the automatic segmentation of diffusion tensor images. Taking a statistical region-based approach, certain exemplary embodiments can use an appropriate piece-wise smooth image model. Certain exemplary methods can be adapted to capture highly convoluted brain structures on very noisy datasets. Benefiting from existing tensor segmentation algorithms, desirable features can be combined together in a single unified framework. For an attempted minimization, a greedy region-growing technique can be utilized that can be efficient and can comprise a straightforward stopping condition. Contrary to segmentation algorithms that only use scalar tensor derived quantities to guide the segmentation, or use sophisticated computations on statistical manifolds, certain exemplary vector representation can simplify computations and yet can perform a segmentation task remarkably well. Further improvement may be obtained by plugging-in more sophisticated tensor metrics at the expense of increased computational costs. Results presented agreed remarkably well with corresponding anatomy images, and compared favorably to images obtained via competitive algorithms (results not illustrated). Computational costs can be lower in certain exemplary embodiments. Availability of accurate, fast and highly automated techniques can allow extensive evaluation of the algorithm on large databases, for example, allowing studies of anatomical shape variability across subjects.

FIG. 1A is a diagram of an exemplary sweep across a full image.

Figure 1B:
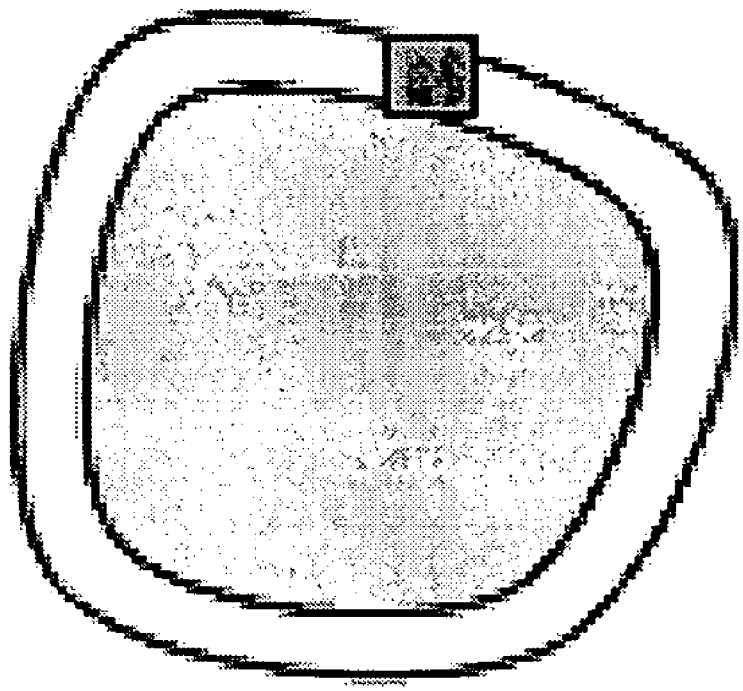
FIG. 1B is a diagram of growing procedure producing a single connected component.

FIG. 1B is a diagram of growing procedure producing a single connected component.

Figure 2:
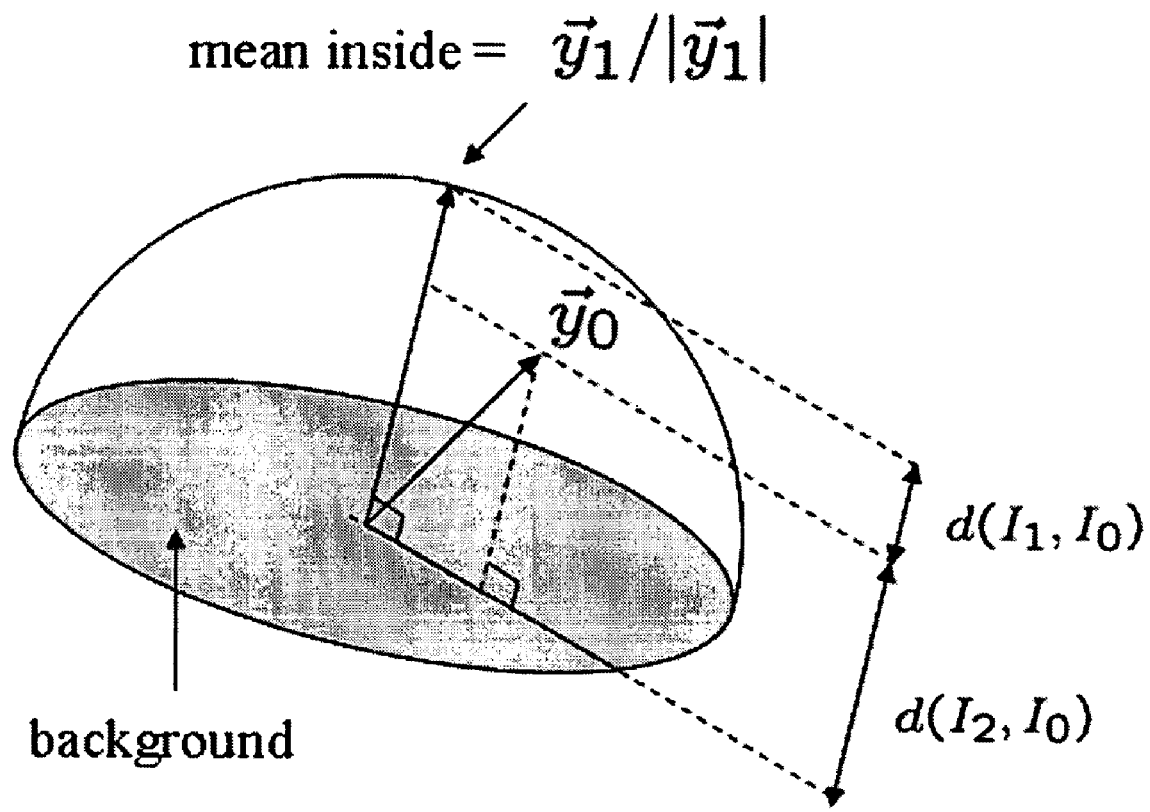
FIG. 2 is an exemplary representation of a tensor.
Figure 3A:
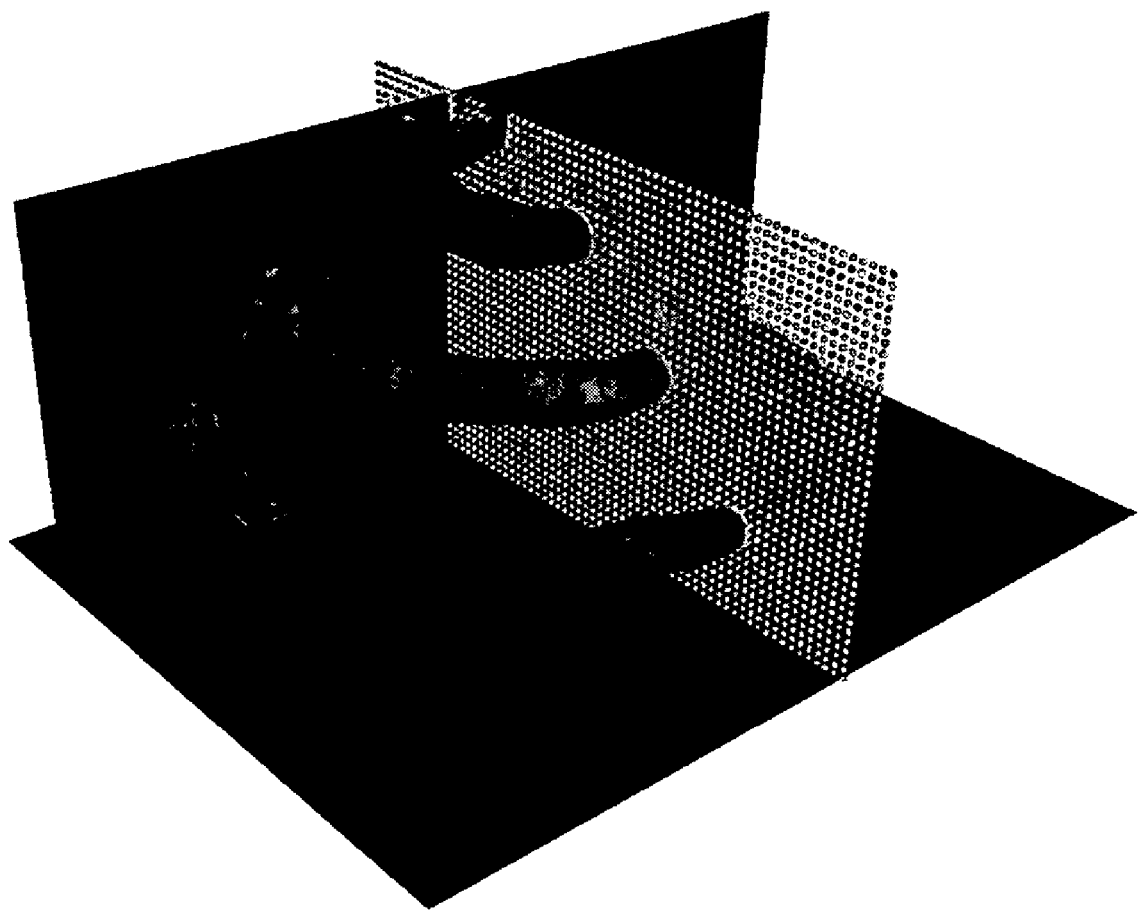
FIG. 3A is an exemplary segmentation image.
Figure 3B:
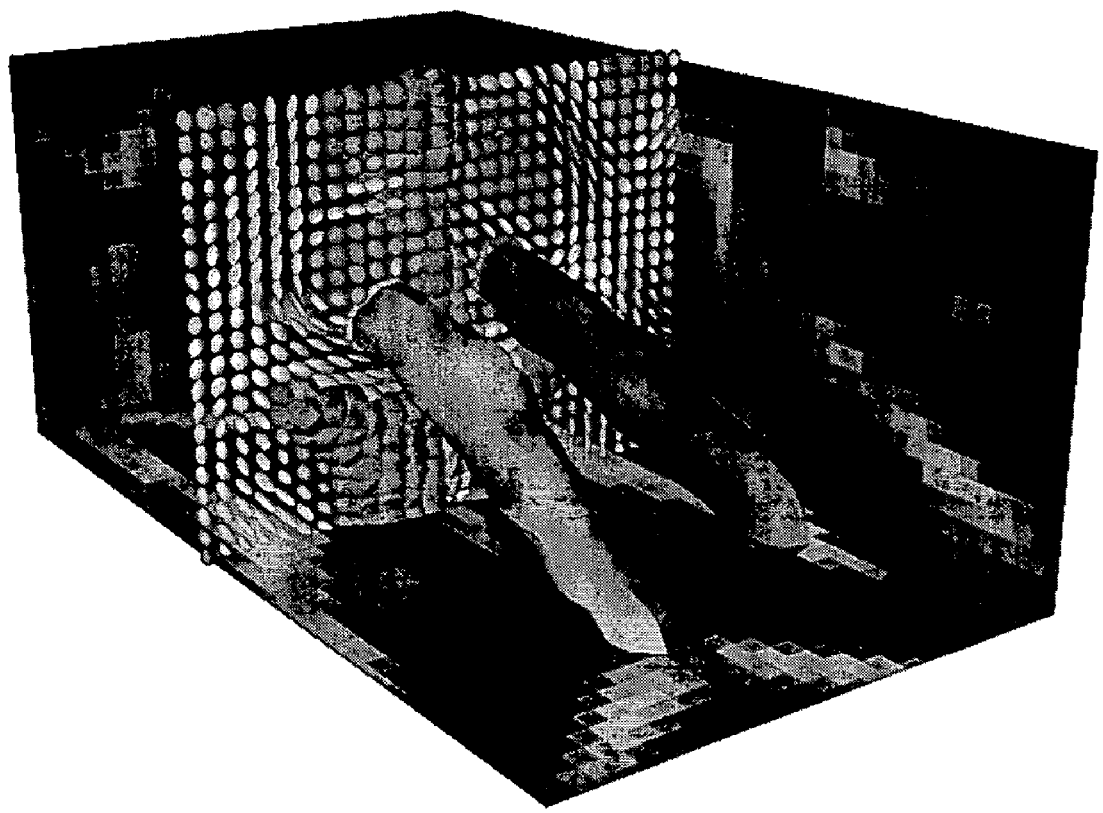
FIG. 3B is an exemplary segmentation image.
Figure 3C:
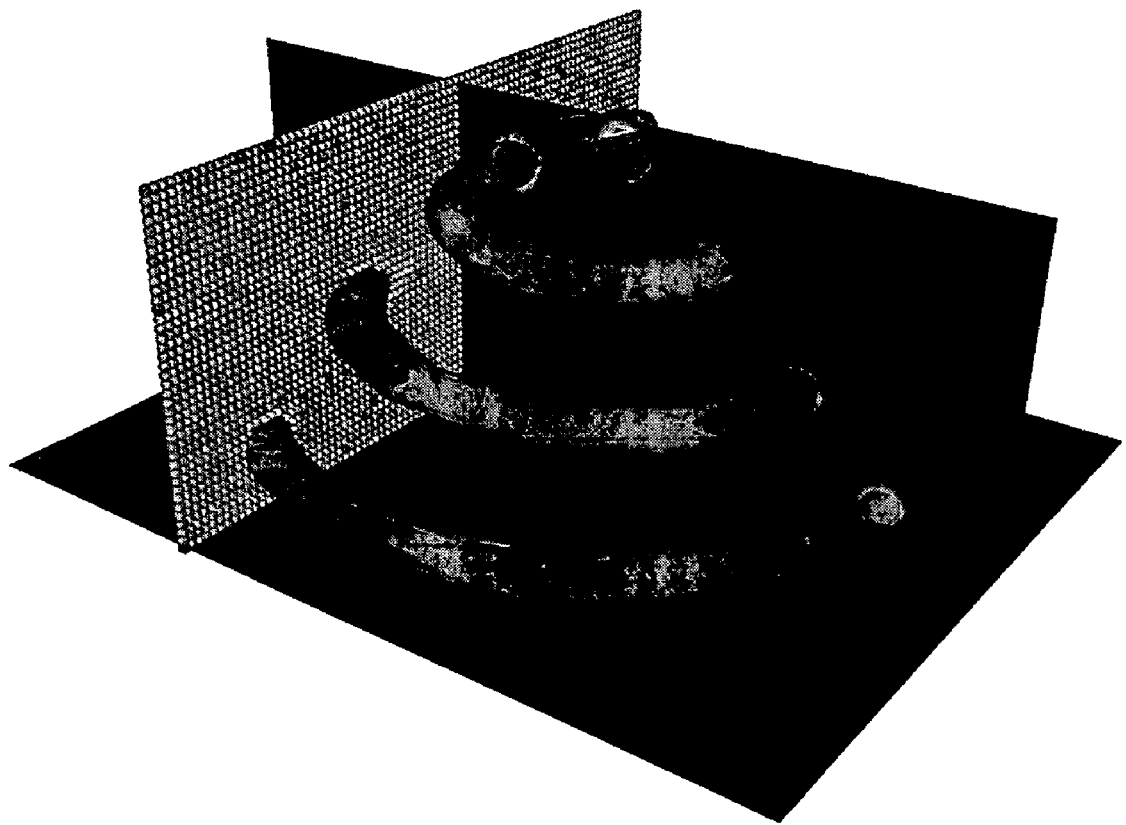
FIG. 3C is an exemplary segmentation image.
Figure 3D:
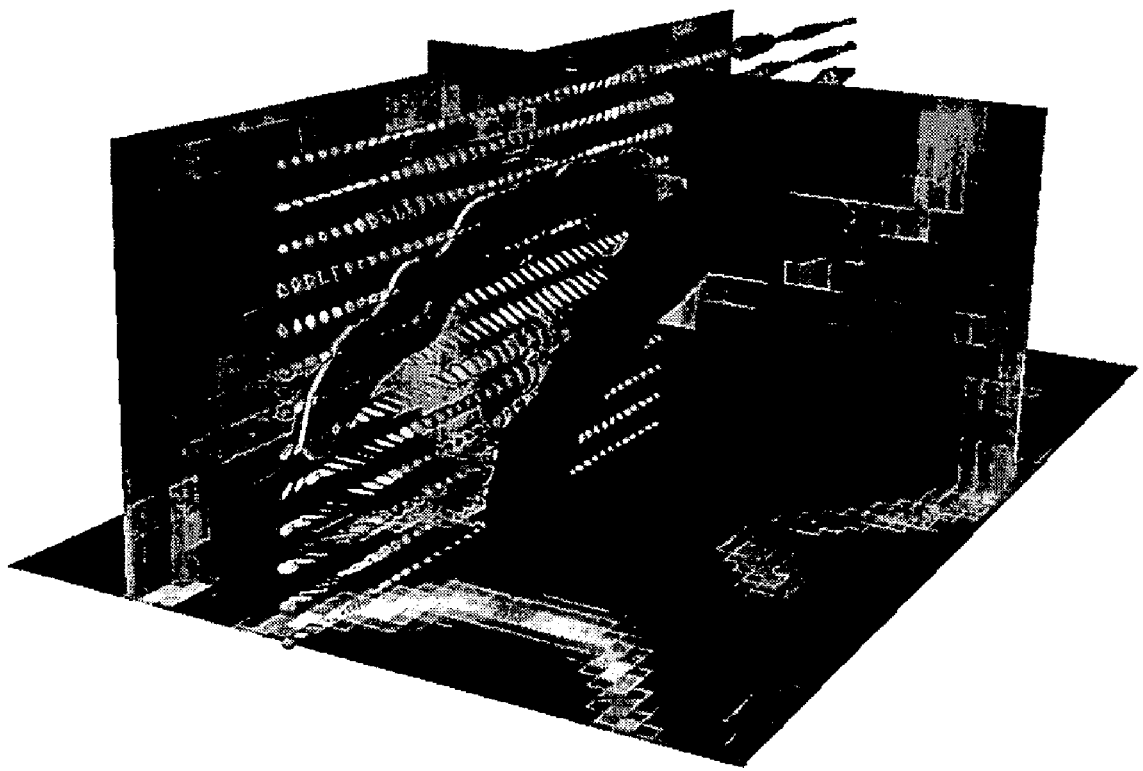
FIG. 3D is an exemplary segmentation image.
Figure 4A:
FIG. 4A is an exemplary segmentation image.
Figure 4B:
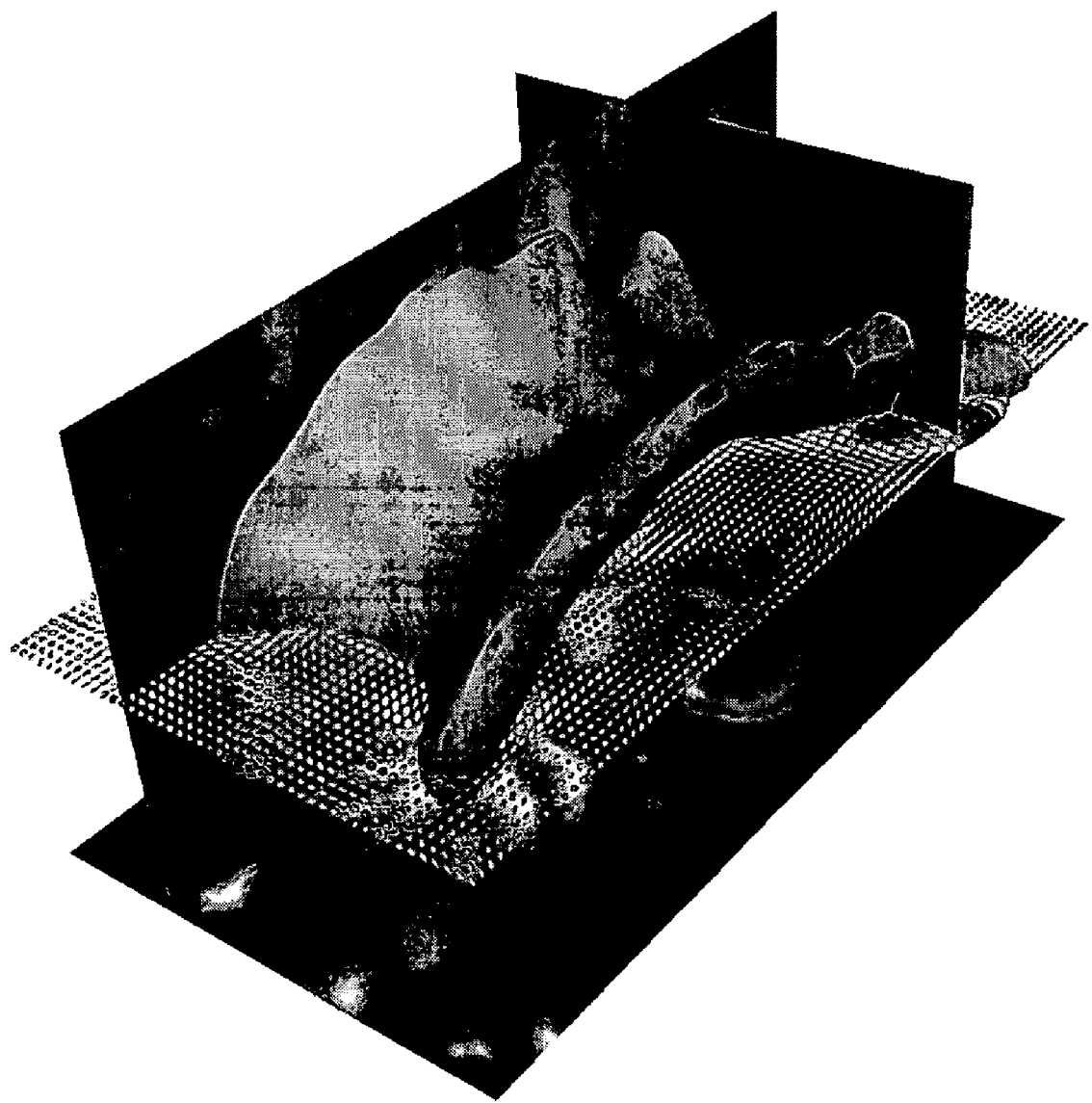
FIG. 4B is an exemplary segmentation image.
Figure 4C:
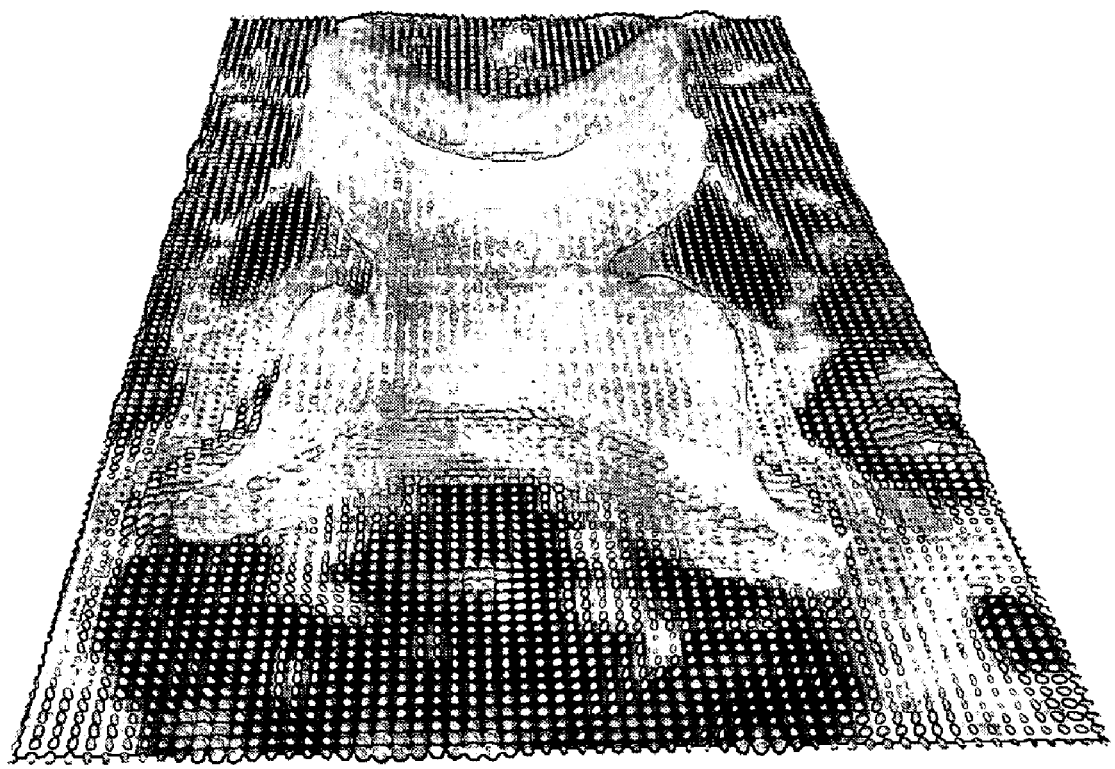
FIG. 4C is an exemplary segmentation image.
Figure 5A:
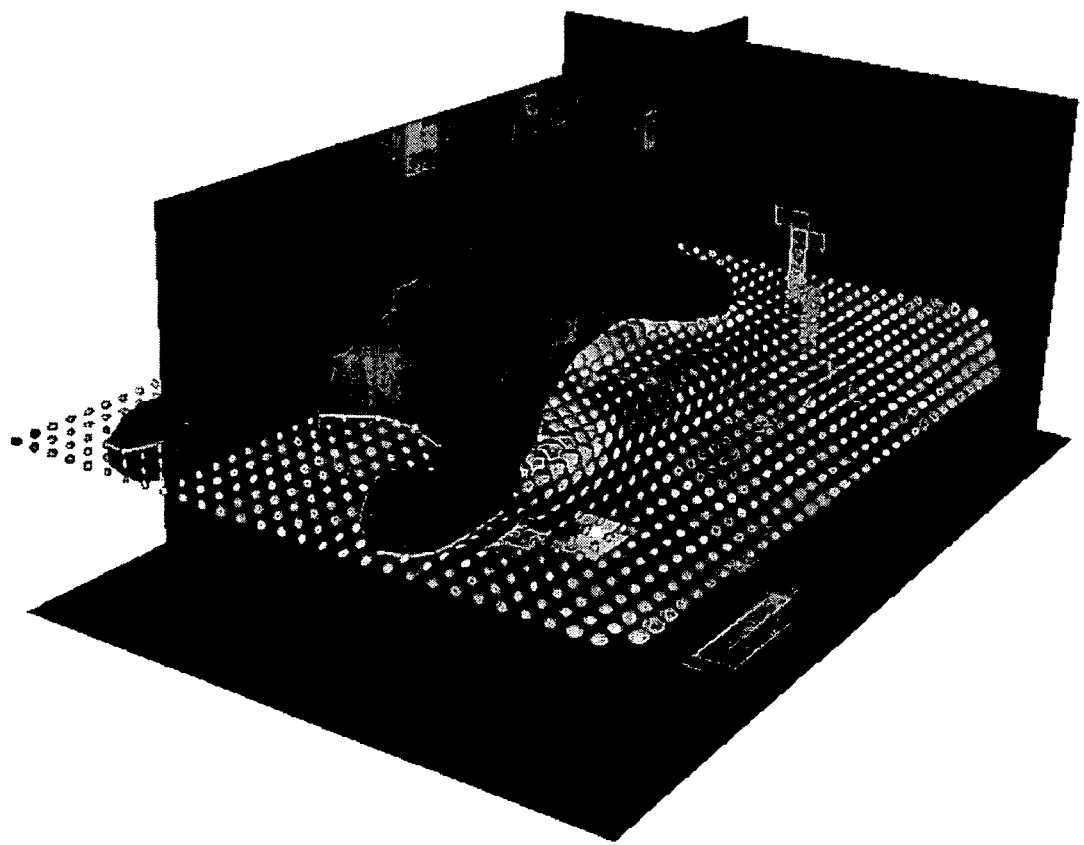
FIG. 5A is an exemplary segmentation image.
Figure 5B:
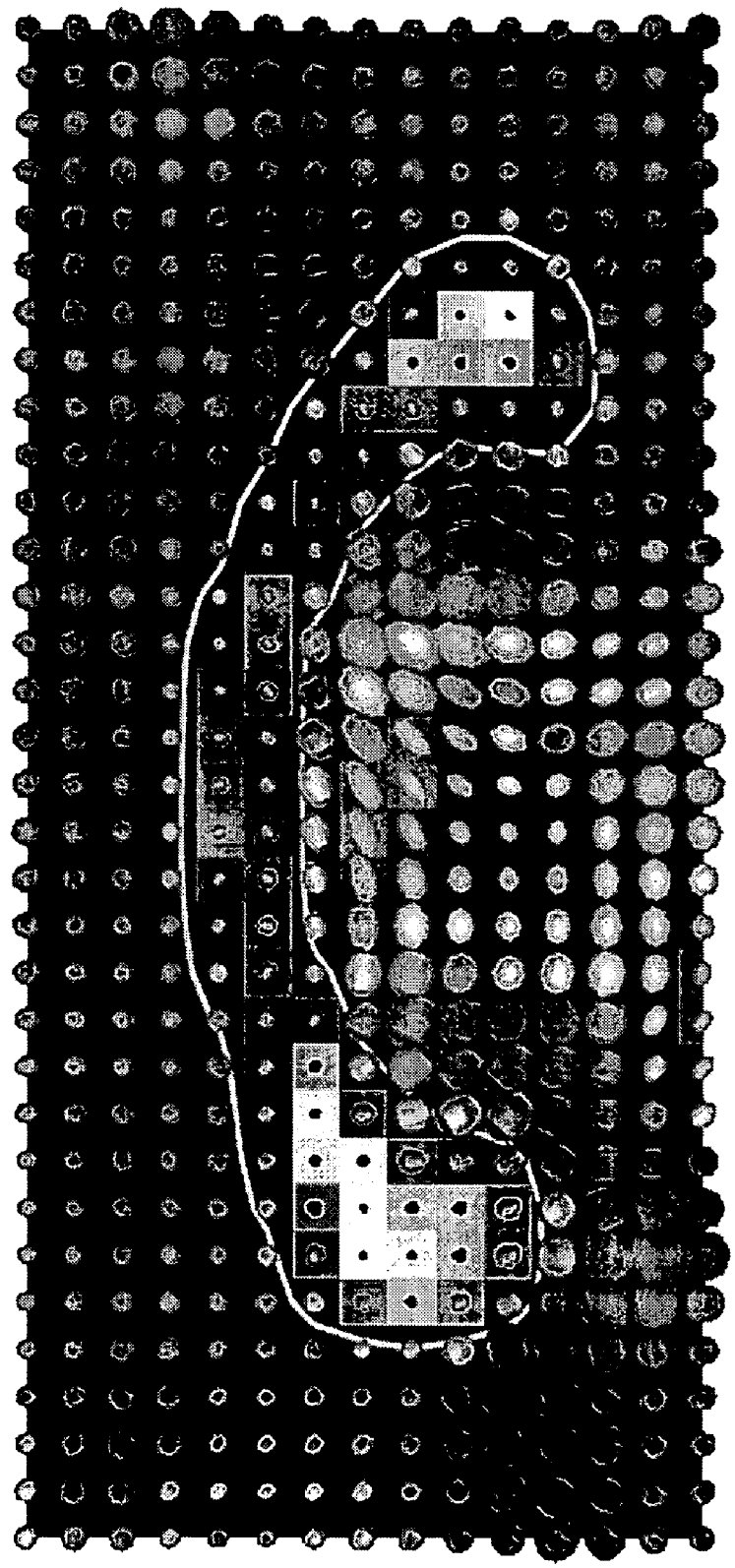
FIG. 5B is an exemplary segmentation image.
Figure 5C:
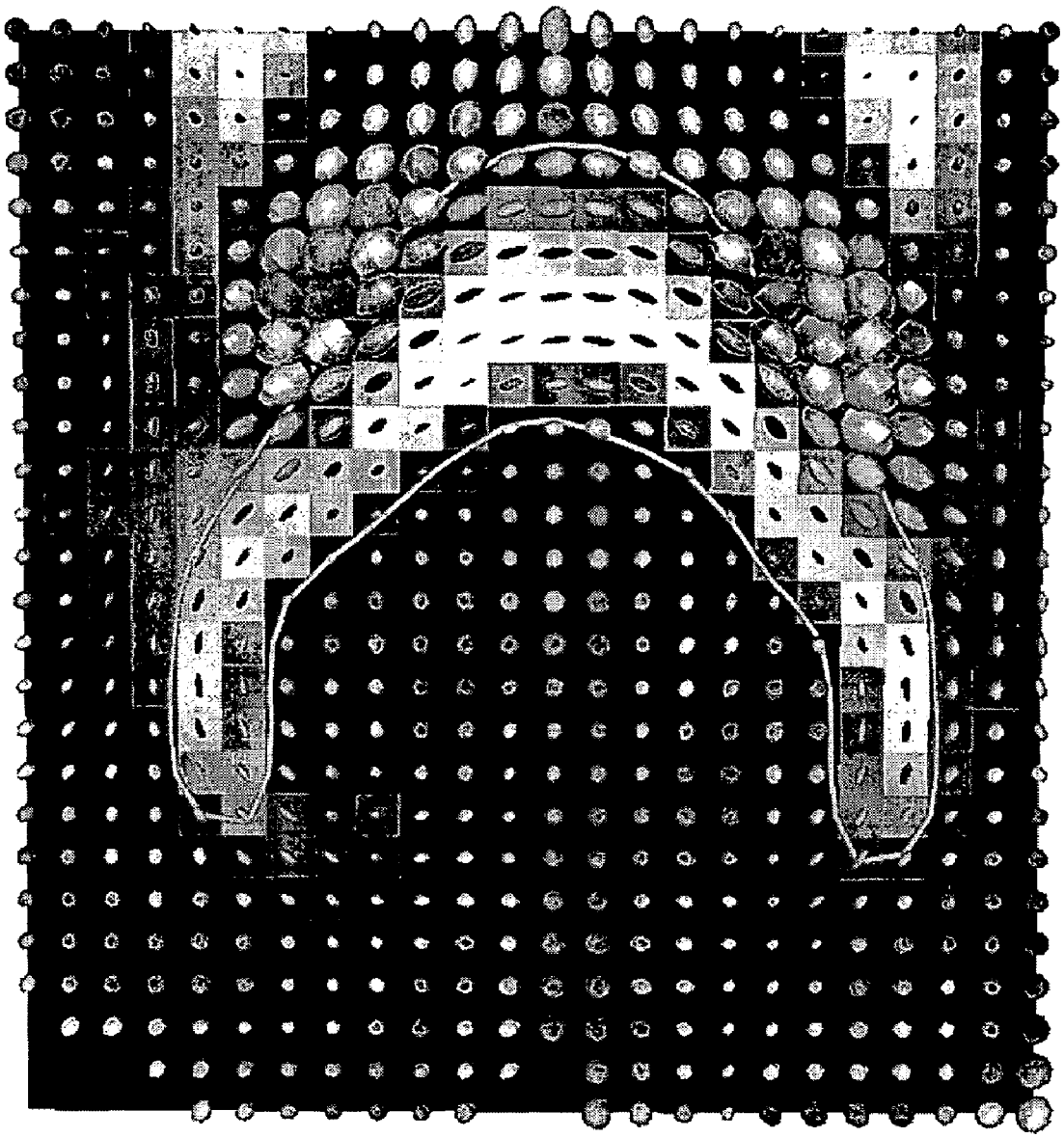
FIG. 5C is an exemplary segmentation image.
Figure 5D:
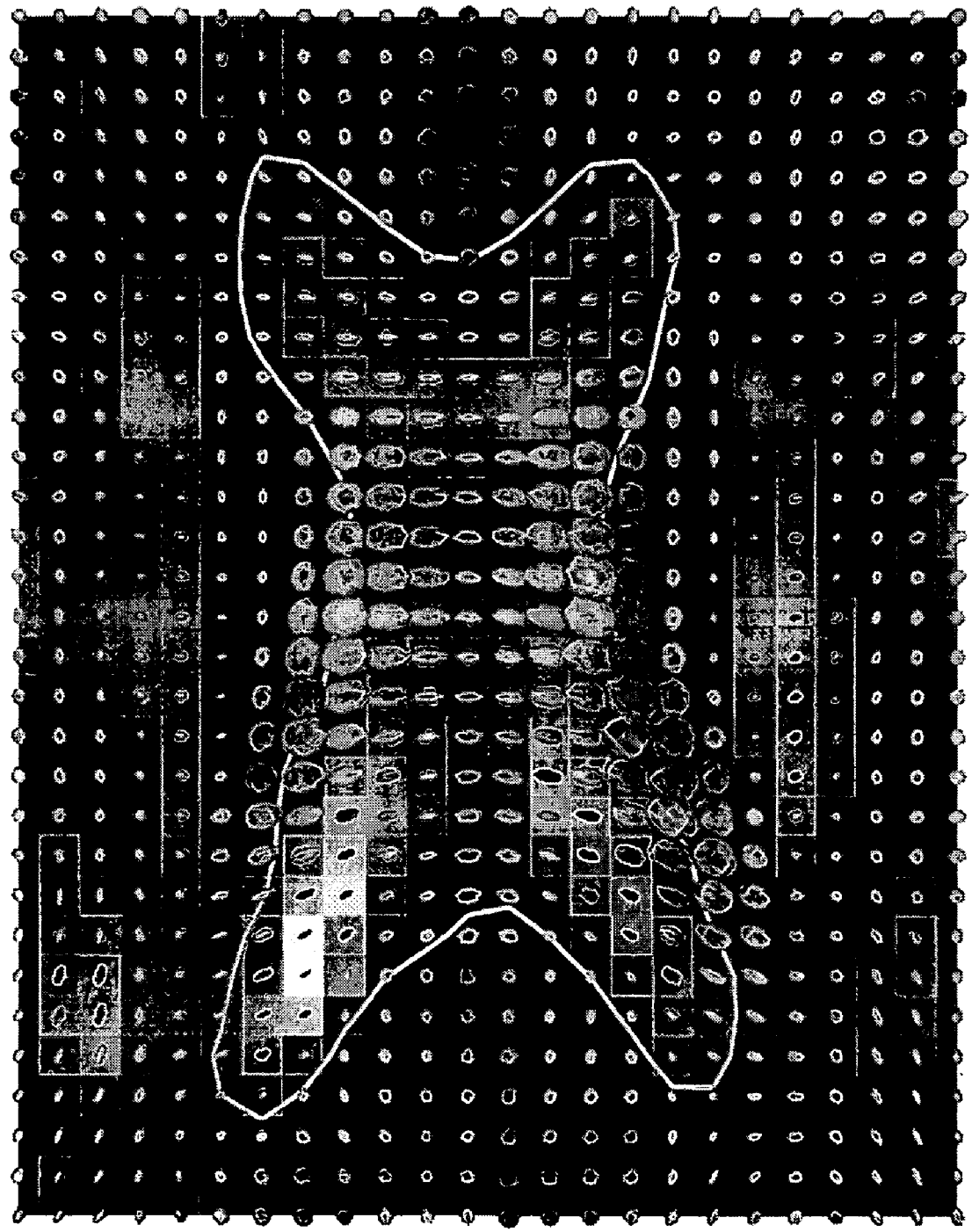
FIG. 5D is an exemplary segmentation image.

FIG. 2 is an exemplary representation of a tensor.
FIG. 3A is an exemplary segmentation image.
FIG. 3B is an exemplary segmentation image.
FIG. 3C is an exemplary segmentation image.
FIG. 3D is an exemplary segmentation image.
FIG. 4A is an exemplary segmentation image.
FIG. 4B is an exemplary segmentation image.
FIG. 4C is an exemplary segmentation image.
FIG. 5A is an exemplary segmentation image.
FIG. 5B is an exemplary segmentation image.
FIG. 5C is an exemplary segmentation image.
FIG. 5D is an exemplary segmentation image.

Figure 6:
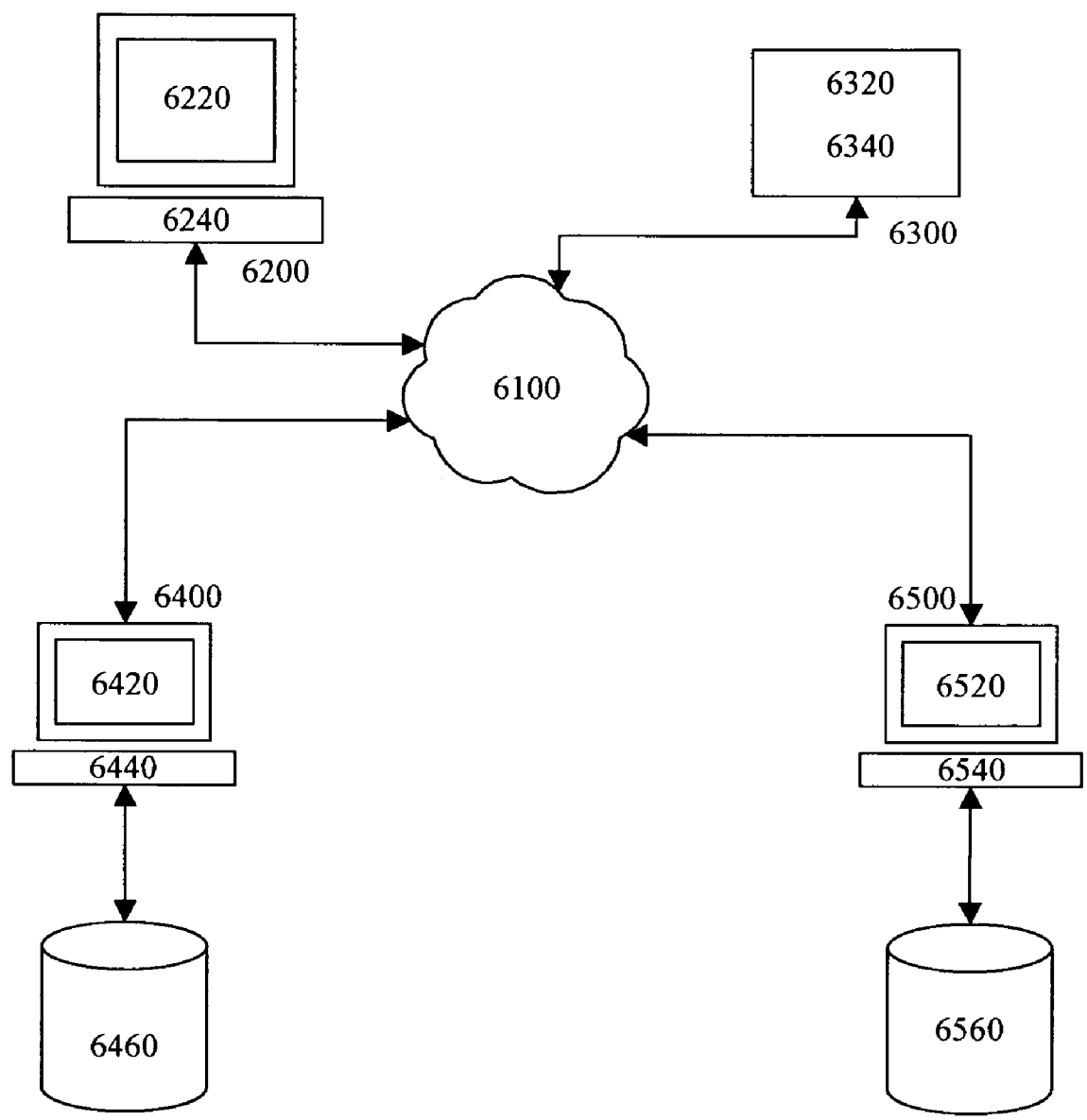
FIG. 6 is a block diagram of an exemplary embodiment of a system 6000.

FIG. 6 is a block diagram of an exemplary embodiment of a system 6000, which can comprise a magnetic resonance imaging system Magnetic Resonance Imaging Device (MRI) 6300. MRI 6300 can comprise a Magnetic Resonance Imaging Sensor 6320 and a Magnetic Resonance Imaging Detector 6340. MRI 6300 can be communicatively coupled to an information device 6200, which can comprise a user interface 6220 and a user program 6240. MRI 6300 can be communicatively coupled to a first server 6400, which can comprise a user interface 6420 and a user program 6440. First server 6400 can comprise and/or be communicatively coupled to a memory device 6460. MRI 6300 can be communicatively coupled to a second server 6500, which can comprise a user interface 6520 and a user program 6540. Second server 6500 can comprise and/or be communicatively coupled to a memory device 6560.

Via user interface 6220, user interface 6420, and/or user interface 6520 a user can view renderings and/or information regarding renderings of images derived from MRI 6300. User program 6420, user program 6440, and/or user program 6540 can be configured to receive and/or process information related to rendering images derived from MRI 6300.

Memory device 6460 and/or memory device 6560 can be machine readable media. Memory device 6460 and/or memory device 6560 can comprise machine instructions for activities comprising automatically causing a representation of body tissue to be rendered. For example, the body tissue can be a brain, portion of a brain, brain fiber bundle, lung, heart, liver, pancreas, kidney, arm, leg, stomach, digestive tract, spinal column, and/or lymphatic system, etc. The body tissue can be human, canine, feline, bovine, and/or related to any other type of animal, etc. The representation of the body tissue can comprise a plurality of voxels located in an interior region of the body tissue. Each of the plurality of voxels can have a negative value of $\Delta E(x)$, when $\Delta E(x)$ is computed via:

$$\Delta E(x) = \log\frac{\sigma_1}{\sigma_2} + \frac{1}{2}\frac{d^2(I_1(x), I_0(x))}{\sigma_1^2} - \frac{1}{2}\frac{d^2(I_2(x), I_0(x))}{\sigma_2^2} + |\nabla_d I_1(x)|^2 - |\nabla_d I_2(x)|^2 + \Delta a(x)$$

where:
$\Delta E(x)$ is an energy change function;
$\sigma_1$ is a variance of tensor distances for voxels located in the interior region;
$\sigma_2$ is a variance of tensor distances for voxels located in an exterior region;
$I_0$ is an initial approximation of a tensor image;
$I_1$ is a tensor image defined in the interior region;
$I_2$ is a tensor image defined in the exterior region;
d is a distance measurement between a pair of tensors;
$\nabla_d$ is an intrinsic gradient under a metric of a tensor image function;
$\Delta a(x)$ is a change in surface area caused by promoting a particular voxel to the interior region; and
x represents three dimensional coordinates of a point in Euclidean space, the point directly related to the particular voxel.

Information device 6200, first server 6400, and/or second server 6500 can be configured to transmit a signal via network 6100. The signal can comprise machine instructions for automatically causing a representation of body tissue to be rendered. The representation of the body tissue can comprise a plurality of voxels located in an interior region of the body tissue. Each of the plurality of voxels can have a negative value of $\Delta E(x)$, when $\Delta E(x)$ is computed via:

$$\Delta E(x) = \log\frac{\sigma_1}{\sigma_2} + \frac{1}{2}\frac{d^2(I_1(x), I_0(x))}{\sigma_1^2} - \frac{1}{2}\frac{d^2(I_2(x), I_0(x))}{\sigma_2^2} + |\nabla_d I_1(x)|^2 - |\nabla_d I_2(x)|^2 + \Delta a(x)$$

where:
$\Delta E(x)$ is an energy change function;
$\sigma_1$ is a variance of tensor distances for voxels located in the interior region;
$\sigma_2$ is a variance of tensor distances for voxels located in an exterior region;
$I_0$ is an initial approximation of a tensor image;
$I_1$ is a tensor image defined in the interior region;
$I_2$ is a tensor image defined in the exterior region;
d is a distance measurement between a pair of tensors;
$\nabla_d$ is an intrinsic gradient under a metric of a tensor image function;
$\Delta a(x)$ is a change in surface area caused by promoting a particular voxel to the interior region; and
x represents three dimensional coordinates of a point in Euclidean space, the point directly related to the particular voxel.

Figure 7:
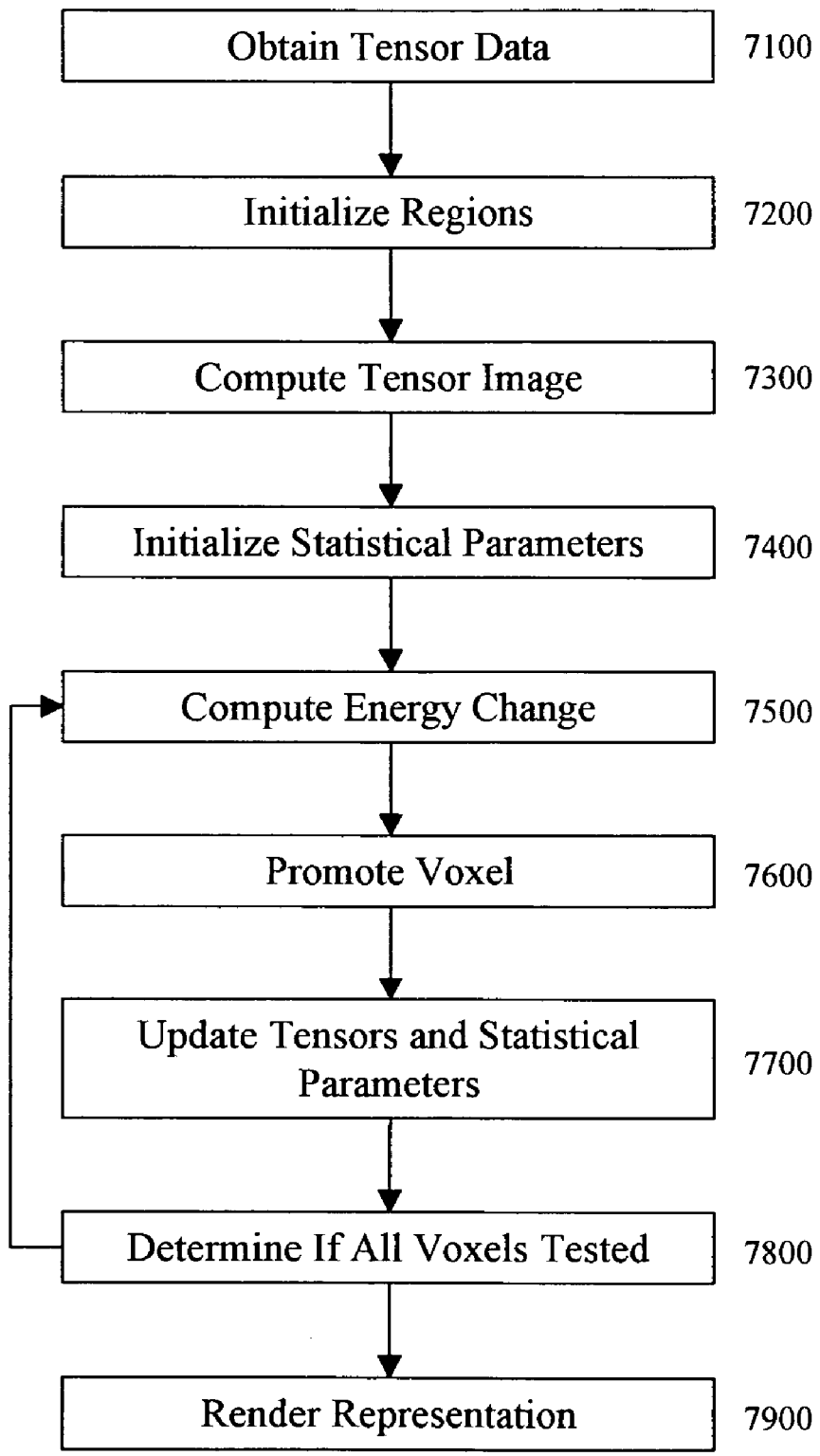
FIG. 7 is a flowchart of an exemplary embodiment of a method 7000.

FIG. 7 is a flowchart of an exemplary embodiment of a method 7000. At activity 7100, tensor data can be obtained. The tensor data can be obtained from an MRI sensor/detection system and can be related to a body tissue, such as a brain fiber bundle.

At activity 7200, an interior region and/or an exterior region can be initialized. The interior region can be initialized to a single voxel located inside the body tissue. The exterior region can be initialized and/or defined as a band of neighboring voxels approximately surrounding the interior region. The interior region can be initially identified based upon detected anisotropic properties of the single voxel.

At activity 7300, an initial tensor image can be calculated. The initial tensor image of the interior region can be calculated based upon voxels comprised in the interior region. In certain exemplary embodiments, the tensor image, I, can be piecewise smooth.

At activity 7400, statistical parameters can be initialized. For example, variances of tensors in each of the interior region and the exterior region can be obtained, determined and/or calculated.

At activity 7500, a change in energy, such as a change in energy to the interior region by including a voxel, can be calculated. The energy change can be calculated via:

$$\Delta E(x) = \log\frac{\sigma_1}{\sigma_2} + \frac{1}{2}\frac{d^2(I_1(x), I_0(x))}{\sigma_1^2} -$$
$$\frac{1}{2}\frac{d^2(I_2(x), I_0(x))}{\sigma_2^2} + |\nabla_d I_1(x)|^2 - |\nabla_d I_2(x)|^2 + \Delta a(x)$$

where:

$\Delta E(x)$ is an energy change function;

$\sigma_1$ is a variance of tensor distances for voxels located in the interior region;

$\sigma_2$ is a variance of tensor distances for voxels located in an exterior region;

$I_0$ is an initial approximation of a tensor image;

$I_1$ is a tensor image defined in the interior region;

$I_2$ is a tensor image defined in the exterior region;

d is a distance measurement between a pair of tensors;

$\nabla_d$ is an intrinsic gradient under a metric of a tensor image function;

$\Delta a(x)$ is a change in surface area caused by promoting a particular voxel to the interior region; and x represents three dimensional coordinates of a point in Euclidean space, the point directly related to the particular voxel.

Certain exemplary embodiments can automatically compute d according to an equation:

$$d(I_i(x), I_0(x)) = |\vec{y}_i - \vec{y}_0|$$

where:

$\vec{y}_i$ is a vector that points in a principal orientation of a first tensor and has magnitude proportional to the anisotropy of the first tensor in the interior region; and $\vec{y}_0$ is a candidate vector that points in a principal orientation of a second tensor and has magnitude proportional to the anisotropy of the second tensor in the exterior region.

At activity 7600, the particular voxel can be promoted. The particular voxel can be promoted responsive to a determination of a negative value of $\Delta E(x)$ for the particular voxel. Voxels might not be promoted to the interior region based upon a positive value of $\Delta E(x)$ for the voxels.

At activity 7700, tensors and/or statistical parameters can be updated. For example, a mean tensor associated with the interior region can be computed. The mean tensor can be computed as a local average of tensors inside the interior region. For example, $I_1$ can be automatically updated based upon a local average of tensors inside the interior region and $I_2$ can be automatically updated based upon a local average of tensors inside the exterior region.

In certain exemplary embodiments, statistical parameters $\sigma_i$ can be automatically updated according to equations $$\sigma_1^2 = \frac{\int_\Omega d^2(I_1(x), I_0(x))H(x)dx}{\int_\Omega H(x)dx}$$

$$\sigma_2^2 = \frac{\int_\Omega d^2(I_2(x), I_0(x))(1 - H(x))dx}{\int_\Omega (1 - H(x))dx}.$$

where:

$\Omega$ denotes an image domain (union of the interior region and the exterior region);

d is a distance measurement between two tensors;

$H(x) = \{1, x \in \Omega_1; 0, x \in \Omega_2\}$;

$\Omega_1$ denotes the interior region; and $\Omega_2$ denotes the exterior region.

At activity 7800, a determination can be made regarding whether all testable voxels in the band have been tested. Responsive to a determination that not all desired voxels have been tested, activities 7500 through 7800 can be repeated. Thus, certain exemplary embodiments can repeatedly compute $\Delta E(x)$ for voxels in a band at least partially surrounding the interior region until all voxels associated with a negative energy change have been promoted to the interior region.

At activity 7900, a representation of the body tissue can be transmitted and/or rendered. Certain exemplary embodiments can cause an automatic rendering of a representation of body tissue, such as the brain fiber bundle. The representation of the body tissue can comprise a plurality of voxels located in an interior region of the body tissue. Each of the plurality of voxels can have a negative value of $\Delta E(x)$.

Figure 8:
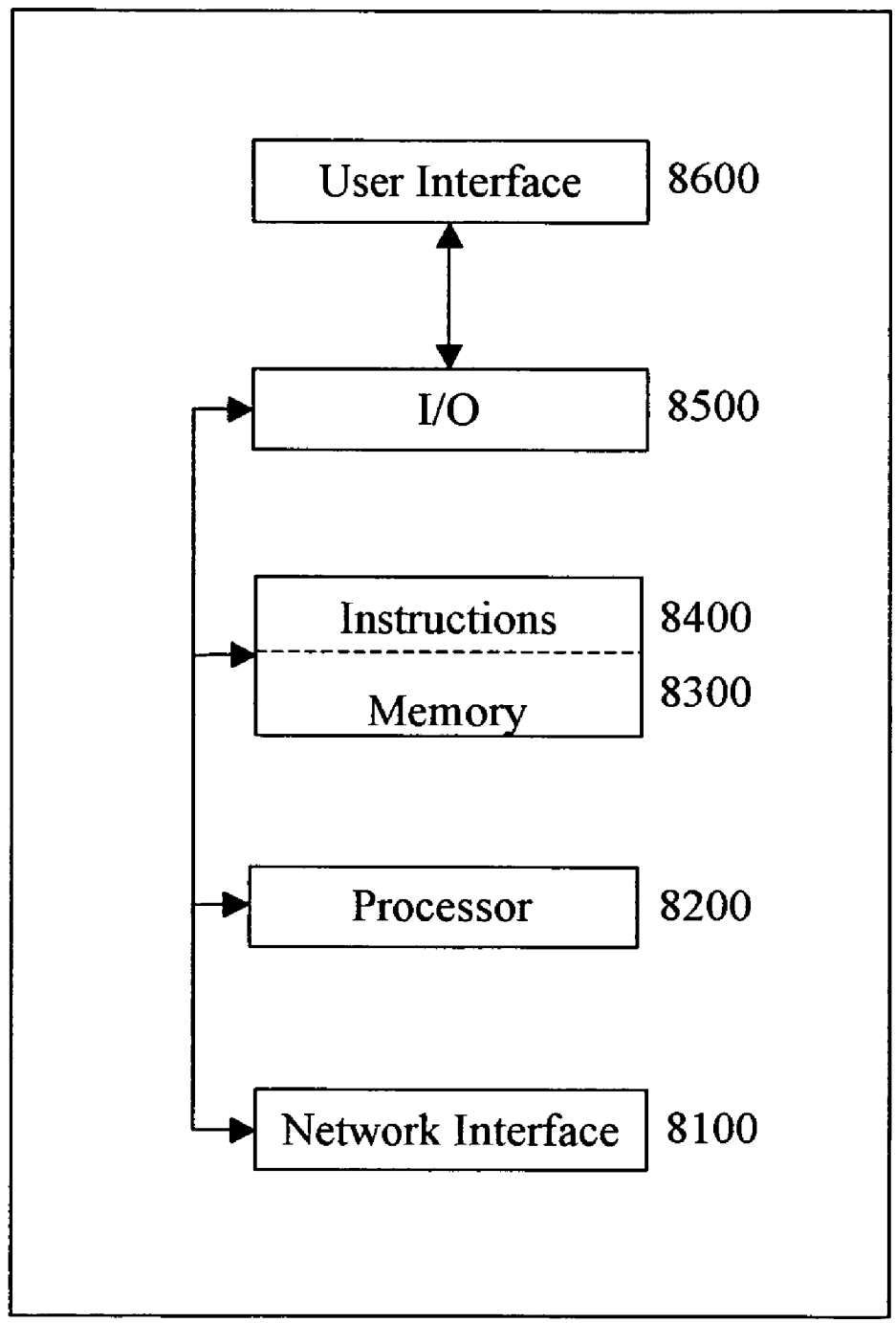
FIG. 8 is a block diagram of an exemplary embodiment of an information device 8000.

FIG. 8 is a block diagram of an exemplary embodiment of an information device 8000, which in certain operative embodiments can comprise, for example, information device 6200, first server 6400, and/or second server 6500 of FIG. 6. Information device 8000 can comprise any of numerous components, such as for example, one or more network interfaces 8100, one or more processors 8200, one or more memories 8300 containing instructions 8400, one or more input/output (I/O) devices 8500, and/or one or more user interfaces 8600 coupled to I/O device 8500, etc.

In certain exemplary embodiments, via one or more user interfaces 8600, such as a graphical user interface, a user can view a rendering of information related to an image determined from information obtained from an MRI system.

Note

Still other practical and useful embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application.

Thus, regardless of the content of any portion (e.g., title, field, background, summary, abstract, drawing figure, etc.) of this application, unless clearly specified to the contrary, such as via an explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

any elements can be integrated, segregated, and/or duplicated;

any activity can be repeated, performed by multiple entities, and/or performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Accordingly, the descriptions and drawings are to be regarded as illustrative in nature, and not as restrictive.

What is claimed is:

1. A method comprising:
via an information device comprising a graphical user interface, said information device communicatively coupled to a magnetic resonance imaging (MRI) machine:
automatically causing a representation of a brain fiber bundle to be rendered, said representation of said brain fiber bundle comprising a plurality of voxels located in an interior region of said brain fiber bundle, each of said plurality of voxels having a negative value of $\Delta E(x)$ when $\Delta E(x)$ is calculated via:

$$\Delta E(x) = \log\frac{\sigma_1}{\sigma_2} + \frac{1}{2}\frac{d^2(I_1(x), I_0(x))}{\sigma_1^2} - \frac{1}{2}\frac{d^2(I_2(x), I_0(x))}{\sigma_2^2} + |\nabla_d I_1(x)|^2 - |\nabla_d I_2(x)|^2 + \Delta a(x)$$

where:
$\Delta E(x)$ is an energy change function;
$\sigma_1$ is a variance of tensor distances for voxels located in said interior region;
$\sigma_2$ is a variance of tensor distances for voxels located in an exterior region;
$I_0$ is an initial approximation of a tensor image;
$I_1$ is a tensor image defined in said interior region;
$I_2$ is a tensor image defined in said exterior region;
d is a distance measurement between a pair of tensors;
$\nabla_d$ is an intrinsic gradient under a metric of a tensor image function
$\Delta a(x)$ is a change in surface area caused by promoting a particular voxel to said interior region; and
x represents three dimensional coordinates of a point in Euclidean space, the point directly related to said particular voxel.

2. The method of claim 1, further comprising:
promoting a voxel to said interior region based upon a negative value of $\Delta E(x)$.

3. The method of claim 1, further comprising:
not promoting a voxel to said interior region based upon a positive value of $\Delta E(x)$.

4. The method of claim 1, further comprising:
initializing said interior region to a single voxel located inside said brain fiber bundle.

5. The method of claim 1, further comprising:
defining a band comprising neighboring voxels that approximately surround said interior region.

6. The method of claim 1, further comprising:
computing a mean tensor, said mean tensor a local average of tensors inside said interior region.

7. The method of claim 1, further comprising:
automatically updating statistical parameters $\sigma_i$ according to equations $$\sigma_1^2 = \frac{\int_\Omega d^2(I_1(x), I_0(x))H(x)dx}{\int_\Omega H(x)dx}$$

$$\sigma_2^2 = \frac{\int_\Omega d^2(I_2(x), I_0(x))(1-H(x))dx}{\int_\Omega (1-H(x))dx},$$

where:
$\Omega$ denotes an image domain (union of said interior region and said exterior region);
d is a distance measurement between two tensors;
$H(x) = \{1, x\in\Omega_1; 0, x\in\Omega_2\}$;
$\Omega_1$ denotes said interior region; and
$\Omega_2$ said exterior region.

8. The method of claim 1, further comprising:
repeatedly computing $\Delta E(x)$ for voxels in a band at least partially surrounding said interior region until all voxels associated with a negative energy change have been promoted to said interior region.

9. The method of claim 1, further comprising:
automatically updating $I_1$ based upon a local average of tensors inside said interior region.

10. The method of claim 1, further comprising:
automatically updating $I_2$ based upon a local average of tensors inside said exterior region.

11. The method of claim 1, further comprising:
automatically computing d according to an equation:

$$d(I_i(x), I_0(x)) = |\vec{y}_i - \vec{y}_0|$$

where:
$\vec{y}_i$ is a vector that points in a principal orientation of a first tensor and has magnitude proportional to an anisotropy of said first tensor in said interior region; and
$\vec{y}_0$ is a candidate vector that points in a principal orientation of a second tensor and has magnitude proportional to an anisotropy of said second tensor in said exterior region.

12. The method of claim 1, wherein I is piecewise smooth.

13. A machine-readable medium storing machine-implementable instructions for activities comprising:
automatically causing a representation of a brain fiber bundle to be rendered, said representation of said brain fiber bundle comprising a plurality of voxels located in an interior region of said brain fiber bundle, each of said plurality of voxels having a negative value of $\Delta E(x)$ when $\Delta E(x)$ is calculated via:

$$\Delta E(x) = \log\frac{\sigma_1}{\sigma_2} + \frac{1}{2}\frac{d^2(I_1(x), I_0(x))}{\sigma_1^2} - \frac{1}{2}\frac{d^2(I_2(x), I_0(x))}{\sigma_2^2} + |\nabla_d I_1(x)|^2 - |\nabla_d I_2(x)|^2 + \Delta a(x)$$

where:
$\Delta E(x)$ is an energy change function;

$\sigma_1$ is a variance of tensor distances for voxels located in said interior region;

$\sigma_2$ is a variance of tensor distances for voxels located in an exterior region;

$I_0$ is an initial approximation of a tensor image;

$I_1$ is a tensor image defined in said interior region;

$I_2$ is a tensor image defined in said exterior region;

d is a distance measurement between a pair of tensors;

$\nabla_d$ is an intrinsic gradient under a metric of a tensor image function;

$\Delta a(x)$ is a change in surface area caused by promoting a particular voxel to said interior region; and x represents three dimensional coordinates of a point in Euclidean space, the point directly related to said particular voxel.

* * * * *